United States Patent
Novak (10) Patent No.: US 6,606,012 B2
(45) Date of Patent: Aug. 12, 2003

(54) WIDEBAND BYPASS CAPACITOR METHODS FOR ACHIEVING A DESIRED VALUE OF ELECTRICAL IMPEDANCE BETWEEN PARALLEL PLANAR CONDUCTORS OF AN ELECTRICAL POWER DISTRIBUTION STRUCTURE

(75) Inventor: Istvan Novak, Maynard, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 213 days.

(21) Appl. No.: 09/826,997

(22) Filed: Apr. 3, 2001

(65) Prior Publication Data

US 2002/0180465 A1 Dec. 5, 2002

(51) Int. Cl.⁷ .................................................. H03H 7/40
(52) U.S. Cl. ......................................... 333/17.3; 333/32
(58) Field of Search .............................. 333/12, 22 R, 333/32, 17.3

(56) References Cited

U.S. PATENT DOCUMENTS

| | | | |
|---|---|---|---|
| 5,027,089 A | 6/1991 | Henke | 333/12 |
| 6,215,372 B1 | 4/2001 | Novak | 333/12 |
| 6,525,622 B1 * | 2/2003 | Novak et al. | 333/32 |

OTHER PUBLICATIONS

Modeling Power Bus Decoupling on Multilayer P.C.B.S. Aug. 1994.
Power Bus Decoupling on Multilayer P.C.B.S. May 1995.
Extended Adaptive Voltage Positioning. Oct. 2000.

* cited by examiner

*Primary Examiner*—Robert Pascal
*Assistant Examiner*—Stephen E. Jones
(74) *Attorney, Agent, or Firm*—Meyertons Hood Kivlin Kowert & Goetzel, P.C.; B. Noël Kivlin (57) ABSTRACT

A method for determining the bypass capacitors in order to achieve a target impedance over a wide frequency range. In one embodiment, a power distribution system of an electronic circuit includes at least one pair of planar conductors, including a power plane and a ground plane. A first capacitor bank may be defined to provide bypassing in a frequency range extending from a maximum frequency down to a first frequency (also referred to as a deviation frequency). The electrical characteristics, or parameters of the first capacitor bank may include a first capacitance, a first resistance, and a first inductance ($C_{10}$, $R_{10}$, and $L_{10}$, respectively). The first resistance may be set to be less than or equal to the required target impedance for the frequency range covered by the first capacitor bank. After the characteristics have been defined for the first capacitor bank, a determination may be made for a required effective inductance of a potential second capacitor bank, which may be used to provide bypassing for a second frequency range. If the required effective inductance is greater than the inductance provided by the output and connection inductance of the power source, then no additional capacitor banks are required. However, if the inductance from the power source is greater than the required effective inductance, then a second capacitor bank may be required. The method may be repeated for additional capacitor banks. Eventually, the power source may be treated as a final capacitor bank with infinite capacitance.

57 Claims, 7 Drawing Sheets

WIDEBAND BYPASS CAPACITOR METHODS FOR ACHIEVING A DESIRED VALUE OF ELECTRICAL IMPEDANCE BETWEEN PARALLEL PLANAR CONDUCTORS OF AN ELECTRICAL POWER DISTRIBUTION STRUCTURE

BACKGROUND OF THE INVENTION

1. Field of the Invention

This invention relates to electronic systems, and more particularly to electrical interconnecting apparatus having two or more electrically connected capacitors.

2. Description of the Related Art

A power distribution network of a typical printed circuit board (PCB) includes several capacitors coupled between conductors used to convey direct current (D.C.) electrical power voltages. For example, the power distribution network of a digital PCB typically includes a bulk decoupling or "power entry" capacitor located at a point where electrical power enters the PCB from an external power supply. The power distribution network also typically includes a decoupling capacitor positioned near each of several digital switching circuits (e.g., digital integrated circuits coupled to the PCB). The digital switching circuits dissipate electrical power during switching times (e.g., clock pulse transitions). Each decoupling capacitor typically has a capacitance sufficient to supply electrical current to the corresponding switching circuit during switching times such that the D.C. electrical voltage supplied to the switching circuit remains substantially constant. The power entry capacitor may, for example, have a capacitance greater than or equal to the sum of the capacitances of the decoupling capacitors.

In addition to supplying electrical current to the corresponding switching circuits during switching times, decoupling capacitors also provide low impedance paths to the ground electrical potential for alternating current (a.c.) voltages. Decoupling capacitors thus shunt or "bypass" unwanted a.c. voltages present on D.C. power trace conductors to the ground electrical potential. For this reason, the terms "decoupling capacitor" and "bypass capacitor" are often used synonymously.

As used herein, the term "bypass capacitor" is used to describe any capacitor coupled between a D.C. voltage conductor and a ground conductor, thus providing a low impedance path to the ground electrical potential for a.c. voltages.

When a desired electrical impedance between a D.C. voltage conductor and a ground conductor is less than the ESR of a single capacitor, it is common to couple more than one of the capacitors in parallel between the D.C. voltage conductor and the ground conductor. In this case, all of the capacitors have substantially the same resonant frequency $f_{res}$, and the desired electrical impedance is achieved over a range of frequencies including the resonant frequency $f_{res}$.

When the desired electrical impedance is to be achieved over a range of frequencies broader than a single capacitor can provide, it is common to couple multiple capacitors having different resonant frequencies between the D.C. voltage conductor and the ground conductor. The ESRs and resonant frequencies of the capacitors are selected such that each of the capacitors achieves the desired electrical impedance over a different portion of the range of frequencies. In parallel combination, the multiple capacitors achieve the desired electrical impedance over the entire range of frequencies.

A digital signal alternating between high and low voltage levels includes contributions from a fundamental sinusoidal frequency (i.e., a first harmonic) and integer multiples of the first harmonic. As the rise and fall times of a digital signal decrease, the magnitudes of a greater number of the integer multiples of the first harmonic become significant. As a general rule, the frequency content of a digital signal extends to a frequency equal to the reciprocal of $\pi$ times the transition time (i.e., rise or fall time) of the signal. For example, a digital signal with a 1 nanosecond transition time has a frequency content extending up to about 318 MHz.

All conductors have a certain amount of electrical inductance. The voltage across the inductance of a conductor is directly proportional to the rate of change of current through the conductor. At the high frequencies present in conductors carrying digital signals having short transition times, a significant voltage drop occurs across a conductor having even a small inductance. Transient switching currents flowing through electrical impedances of D.C. power conductors cause power supply voltage perturbations (e.g., power supply "droop" and ground "bounce"). As signal frequencies increase, continuous power supply planes (e.g., power planes and ground planes) having relatively low electrical inductances are being used more and more. The parallel power and ground planes are commonly placed in close proximity to one another in order to further reduce the inductances of the planes.

The magnitude of electrical impedance between two parallel conductive planes (e.g., adjacent power and ground planes) may vary widely within the frequency ranges of electronic systems with digital signals having short transition times. The parallel conductive planes may exhibit multiple electrical resonances, resulting in alternating high and low impedance values. High impedance values between power and ground planes are undesirable as transient switching currents flowing through the high electrical impedances cause relatively large power supply voltage perturbations.

Modern computer systems have a requirement for power distribution systems with a low impedance between the power and ground planes over a wide frequency range. Typical target impedances for printed circuit boards in modern computer systems may be on the order of milliohms. The target impedance requirement may extend over a bandwidth that reaches from D.C. up to several gigahertz. At higher frequencies, the size of a printed circuit board may become significant, as the propagation delay associated with the power and ground planes becomes an integral parameter of the power distribution system. Furthermore, printed circuit boards may exhibit resonance peaks in their impedance and EMI (electromagnetic interference) profiles. In some cases, if the separation between the power and ground planes of a printed circuit board is small enough, some of the higher resonant frequencies may be inherently suppressed. However, this still leaves the problem of how to suppress lower resonant frequencies, as well as other frequencies that may occur for various reasons (e.g. power system transients, harmonics associated with clock frequencies, etc.).

Achieving a target impedance over a wide bandwidth using bypass capacitors requires the balancing of capacitance, ESR, and equivalent series inductance (ESL). The challenge of achieving the target impedance over a wide bandwidth is made even more difficult by the fact that capacitance is the only parameter that may be freely chosen. Values of ESL for a given capacitor may be greatly affected by its mounting geometry and dimensions. Values of ESR may be greatly affected by the manufacturing process for a given capacitor. Designers of printed circuit assemblies must take great care in balancing these parameters in order to achieve the desired target impedance over the required bandwidth.

SUMMARY OF THE INVENTION

The problems outlined above may in large part be solved by a method for determining the bypass capacitors in order to achieve a target impedance over a wide frequency range. In one embodiment, a power distribution system of an electronic circuit includes at least one pair of planar conductors, including a power plane and a ground plane. The planar conductors may be separated by a dielectric layer. A first capacitor bank may be defined to provide bypassing in a frequency range extending from a maximum frequency down to a first frequency (also referred to as a deviation frequency). The electrical characteristics, or parameters of the first capacitor bank may include a first capacitance, a first resistance, and a first inductance ($C_{10}$, $R_{10}$, and $L_{10}$, respectively). The first capacitance may represent the total capacitance provided by the first capacitor bank, the first resistance may represent the equivalent series resistance (ESR) of the first capacitor bank, and the first inductance may represent the equivalent series inductance (ESL) of the first capacitor bank. The first resistance may be set to be less than or equal to the required target impedance for the frequency range covered by the first capacitor bank. After the characteristics have been defined for the first capacitor bank, a determination may be made for a required effective inductance of a potential second capacitor bank. The second capacitor bank may provide bypassing for a frequency range extending from the first deviation frequency down to a second deviation frequency. In one embodiment, the required effective inductance may be calculated by the formula $$L_{20}=a*(C_{10})*(R_{10})^2.$$

In this formula, $L_{20}$ is the required effective of the second capacitor bank, while a is a mathematical constant (which will be explained in further detail below). If the calculation of $L_{20}$ yields an inductance that is greater than or equal to the output and connection inductance of a connected power source, then there is no need for further capacitor banks. However, if the inductance from the power source is greater than $L_{20}$, then a second capacitor bank may be necessary. This method may be repeated for additional capacitor banks beyond a second bank until the target impedance requirements are met for all frequency ranges. For example, in determining if a third capacitor bank is required, $L_{30}$ may be substituted for $L_{20}$, $C_{20}$ may be substituted for $C_{10}$, and $R_{20}$ may be substituted for $R_{10}$. Eventually, the power source may be treated as a final capacitor bank with infinite capacitance.

The method may be applied to any type of power distribution structure. Such power distribution structures include those having a pair of planar conductors separated by a dielectric, such as a printed circuit board. The method may also be applied to integrated circuits. In general, the method may be applied to any type of power distribution system wherein capacitors are used for bypassing and/or decoupling. This may include systems without planar conductors.

In one embodiment, the capacitors chosen for each capacitor bank may have a quality factor that is less than 1 (Q<1). This may allow the capacitors to provide a target impedance for a wider frequency range. The relationship between bandwidth and quality factor may be expressed as $$BW=F_{res}/Q,$$

wherein BW is the bandwidth, and $F_{res}$ is the resonant frequency of the capacitor. The bandwidth may indicate a frequency range over which the impedance of a given capacitor is at or very near its equivalent series resistance. In some instances, if a very low impedance is required for a narrow frequency range, capacitors with a higher value of Q may be selected.

The method described herein may be performed on a computer system. In one embodiment, a computer system may include a processor and a carrier. The carrier may include one or more of the following: DRAM, SRAM, hard disk storage, flash memory, CD-ROM, and digital versatile disk (DVD). The carrier may store instructions that, when executed by the processor, perform an embodiment of the method for determining the decoupling capacitors. The computer system may also include one or more output devices for displaying results to a user.

Thus, in various embodiments, the method for determining the bypass capacitors in order to achieve a target impedance over a wide frequency range may solve the problems outlined above. The method may allow multiple capacitor banks to provide bypassing for both low and high frequencies. Furthermore, since the power source may serve as a final capacitor bank, the quantity of capacitors used may be minimized.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
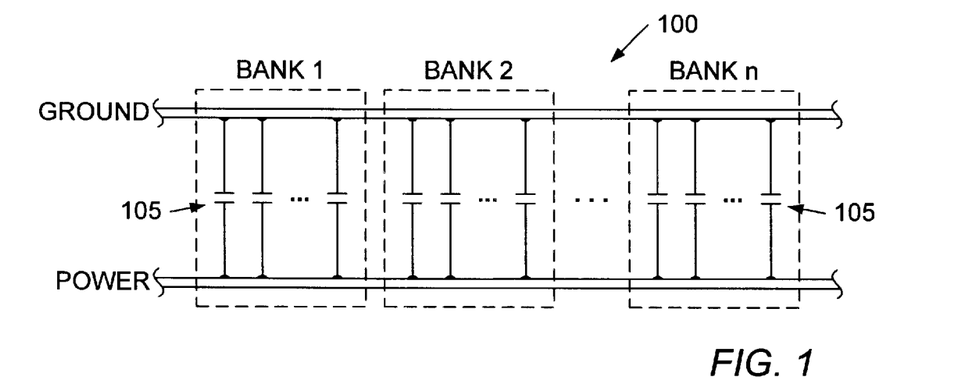
FIG. 1 is a side elevation view of an electrical power distribution structure including multiple capacitor banks coupled between a pair of planar power conductors, wherein each of the capacitor banks includes a plurality of capacitors having substantially identical electrical characteristics.

Turning now to FIG. 1, a side elevation view of an electrical power distribution structure 100 including multiple capacitor banks coupled between a pair of planar power conductors is shown. The electrical power distribution structure may be a printed circuit board, semiconductor substrate, or other type of structure which may be used for distributing power to an electronic circuit. The structure may include a power plane and a ground (or reference) plane as shown in the drawing. The power plane may be used to distribute a d.c. voltage to an circuit to which it is electrically coupled.

In the embodiment shown, each of the capacitor banks includes a plurality of capacitors 105. As can be seen, each of capacitors 105 is connected in an electrically parallel configuration with respect to the other capacitors. Within each capacitor bank, each capacitor 105 may have substantially identical electrical characteristics. For example, the capacitors of the first capacitor bank may have a first capacitance (e.g. 0.1 $\mu$F), the capacitors of the second capacitor bank may have a second capacitance (e.g. 1 $\mu$F), and the capacitors of the third capacitor bank may have a third capacitance (e.g. 10 $\mu$F). In other embodiments, a greater or lesser number of capacitor banks may be present. There is no theoretical limit to the quantity of capacitor banks that may be required. Conversely, as few as one capacitor banks may be required. Details on determining the quantity of required capacitor banks will be discussed further below.

Figure 2:
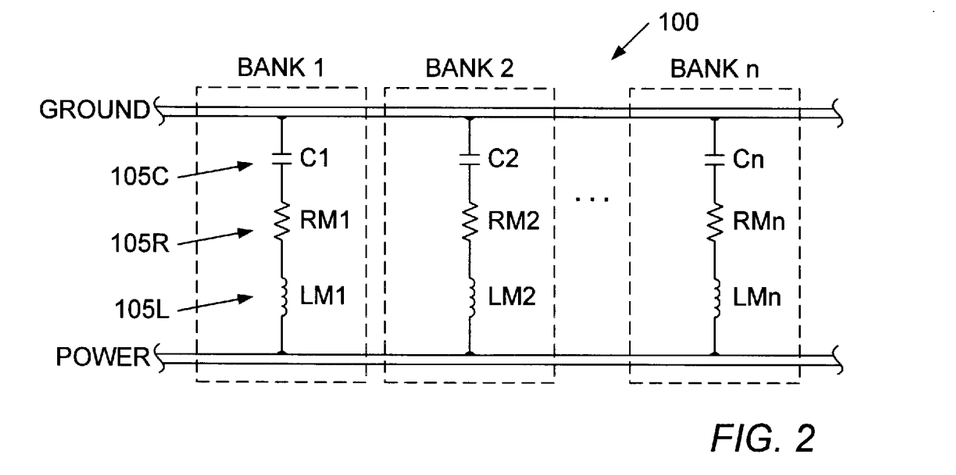
FIG. 2 is a side elevation view of the power distribution structure shown in FIG. 1, wherein the capacitors of the multiple capacitor banks are represented by an equivalent series RLC circuit.

Moving now to FIG. 2, a side elevation view of the power distribution structure 100 shown in FIG. 1, wherein the capacitors 105 of the multiple capacitor banks are represented by an equivalent series RLC circuit is shown. In the embodiment shown, each capacitor is represented by a capacitance 105C, a resistance 105R, and an inductance 105L. The capacitance 105C may be considered to be an ideal capacitor with a capacitance value equal to the value of the capacitor.

The inductance 105L may be considered to be an ideal inductor, and represents the equivalent series inductance (ESL) value of the capacitor. It should be noted that the ESL value may include a mounted inductance value. The mounted inductance value may be an inductance value of a given capacitor when mounted to a carrier such as a printed circuit board. The mounted inductance value may be highly dependent on pad size and pad geometry for surface mounted capacitors, or may be dependent upon plated-through-hole (PTH) size for PTH mounted capacitors. Conversely, a mounted inductance value may be negligible for embodiments wherein the capacitors are embedded in the power distribution structure, such as a printed circuit board with embedded capacitors, or a semiconductor substrate.

The resistance 105R may be considered to be an ideal resistor, with a resistance value equal to the equivalent series resistance (ESR). The equivalent series resistance is the value of the impedance at the resonant frequency of the capacitor, whereby the inductive and capacitive reactances cancel each other out. At the resonant frequency, the capacitor behaves as a simple resistor, and voltage and current will be in phase with each other. The resonant frequency may be calculated by the following formula:

$$f_{res} = \frac{1}{2\pi\sqrt{(ESL)(C)}}$$

wherein $f_{res}$ is the resonant frequency, C is the capacitance value of the capacitor, and ESL is the equivalent series inductance of the capacitor. Note that the ESL value may be modified to include the mounted inductance if necessary.

In addition to considering the resonant frequency of a given capacitor, it may also be important to consider the quality factor (Q) of the capacitor. The quality factor may be used to determine a frequency range over which the impedance provided by a given capacitor is at or near the equivalent series resistance. The quality factor for a given capacitors may be calculated by the following formula:

$$Q = 2\pi f_{res} \frac{ESL}{ESR}$$

where Q is the quality factor, $f_{res}$ is the resonant frequency of the given capacitor, ESL is the capacitor's equivalent series inductance, and ESR is the capacitor's equivalent series resistance. Once the value of Q is determined for a given capacitor, the bandwidth over which the capacitor's impedance is near its ESR can be determined by the formula:

$$BW = \frac{f_{res}}{Q}$$

where BW is the bandwidth, $f_{res}$ is the resonant frequency, and Q is the quality factor. As can be seen by inspecting this equation, there is a wide frequency range around the resonant frequency where the impedance is close to for values of Q<<1. In one embodiment, small values of Q may be preferred in order to provide an impedance that is less than or equal to the target impedance over a wide frequency range. In some cases, however, it may be desirable to provide an extremely low impedance over a very narrow frequency range (i.e. a "notch"). In such cases, a capacitor with a value of Q>>1 may be chosen.

If a single capacitor is unable to meet the target impedance requirements, multiple capacitors having the same rated electrical characteristics may be used. The impedance provided by a given capacitor bank may be calculated by the formula R=ESR/N, where R is the impedance, ESR is the equivalent series resistance for a single capacitor of the bank, and N is the quantity of the capacitors in the bank. If the impedance value is greater than the target impedance, additional capacitors may be added to the bank until the quantity is sufficient to provide an impedance that is at or below the target impedance.

Figure 3:
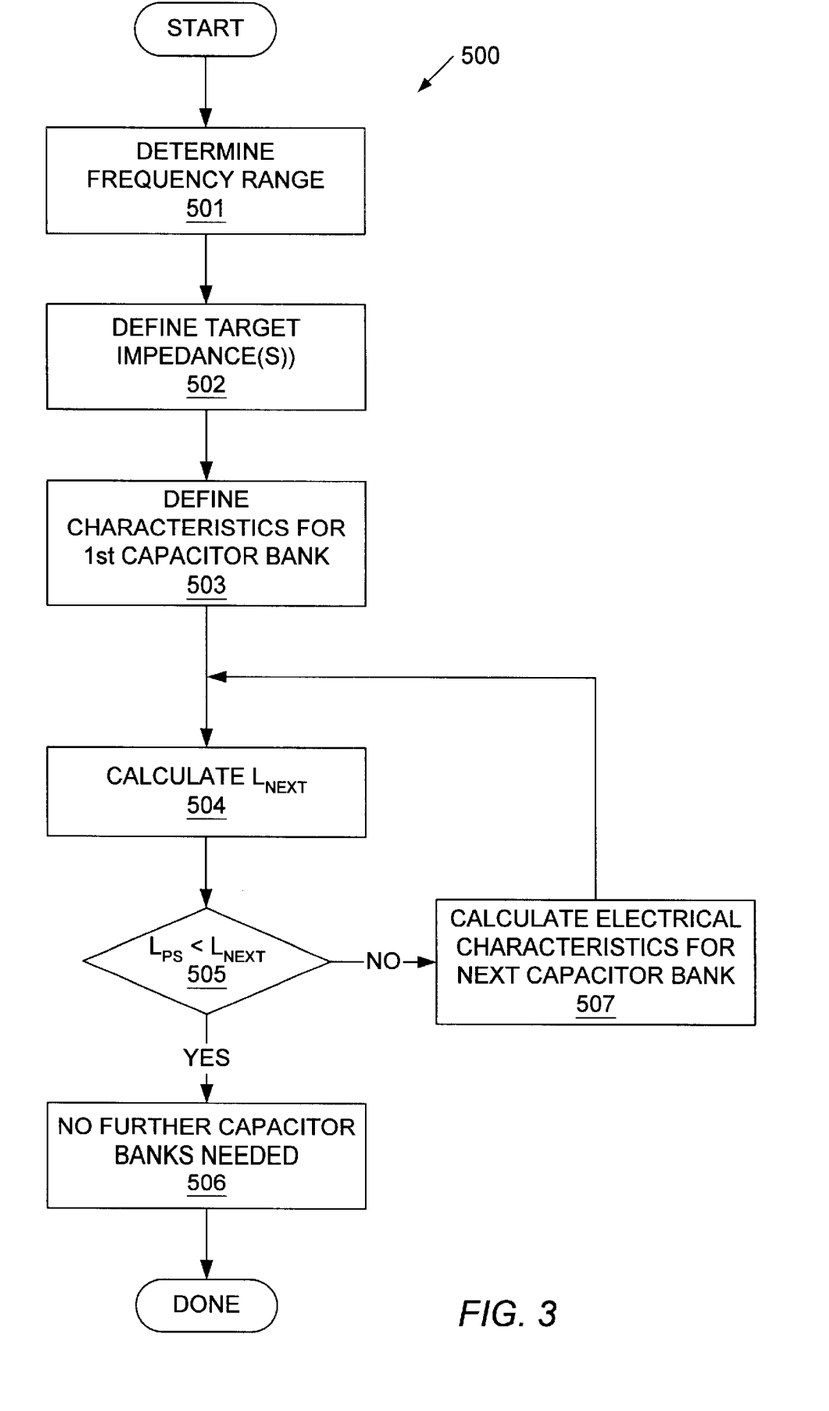
FIG. 3 is a flow diagram of one embodiment of the methodology for achieving the desired target impedance over the required bandwidth.

FIG. 3 is a flow diagram of one embodiment of the methodology for achieving the desired target impedance over the required bandwidth. Method 500 may be used for determining the required bypass capacitors over a wide frequency range. Method 500 may begin with step 501, which is the determination of the frequency range for which bypassing is to be provided. The frequency range may include several sub-ranges for which capacitor banks may be required.

In step 502, the target impedances for each frequency range are defined. In some embodiments, the target impedance may be the same for all frequency ranges. In other embodiments, the target impedance may be different for one or more of the frequency ranges. This may be an important consideration, as it is necessary to prevent impedance peaks from occurring at the frequencies defining the end of one frequency range and the beginning of another frequency range (referred to here as deviation frequencies). This will be explained further with reference to step 504.

In step 503, electrical parameters (i.e. characteristics) of a first capacitor bank are defined. The parameters may include, but are not limited to, a capacitance value, a target impedance value, and an inductance value. The capacitance value may be defined by the capacitance value of a single capacitor selected for the first capacitor bank, and the quantity of capacitors in the first bank, or $C_{10}=N*C_1$, wherein $C_{10}$ is the total capacitance of the first capacitor bank, N is the quantity of capacitors in the bank, and $C_1$ is the capacitance of a single capacitor within the bank. The inductance value of the first capacitor bank may be determined by the formula $L_{10}=ESL_1/N$, wherein $L_{10}$ is the inductance value of the first capacitor bank and $ESL_1$ is the equivalent series inductance of a single capacitor within the bank. Similarly, the impedance provided by the first capacitor bank may be found by the formula $R_{10}=ESR_1/N$, where $R_{10}$ is an impedance that is substantially equal to the target impedance and $ESR_1$ is the equivalent series resistance of a single capacitor within the bank. The quantity of capacitors N may be adjusted in order to get the impedance to a value that is as close as possible while still being less than or equal to the target impedance.

Figure 10:
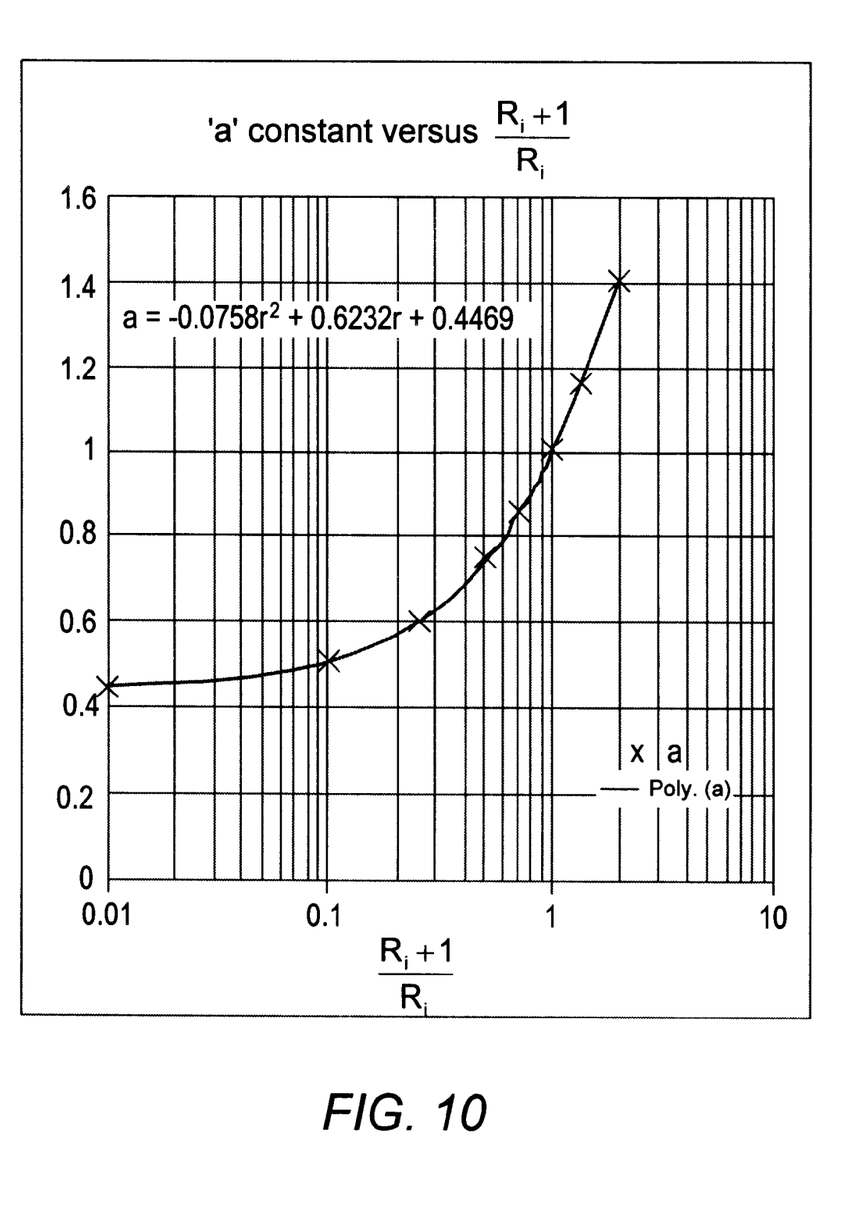
FIG. 10 is a graph illustrating the constant 'a' that may be required for calculations necessary to determine the need for additional capacitor banks.

In order that a smooth impedance transition may be provided between two capacitor banks at the first deviation frequency, the equivalent characteristic impedance formed by the capacitance of a first bank and the inductance of the second bank should match the impedance of the first bank. This may require the determination of the required effective inductance of the second capacitor bank, $L_{Next}$ (which would be $L_{20}$ in the case of a second capacitor bank, $L_{30}$ in the case of a third, and so on), which is performed in step 504. A first capacitor bank may be defined by the quantities $R_{10}$, $C_{10}$, and $L_{10}$, as described above. A second capacitor bank may be defined by the quantities $R_{20}$, $C_{20}$, and $L_{20}$. In order to provide a smooth impedance transition between the first and second capacitor banks, the inductance of the second capacitor bank must satisfy the equation:

$$L_{20}=a*(C_{10})*(R_{10})^2$$

where 'a' is a mathematical constant. The constant 'a' will be equal to 1 in cases where the target impedances of the first and second capacitor banks (and thus the first and second frequency ranges) are equal. If the target impedances for the first and second frequency ranges are not equal, the constant 'a' will be a value other than 1. The constant 'a' will be explained in further detail below in reference to FIG. 10. Meeting the inductance requirements for a second capacitor bank (and subsequent capacitor banks) may prevent impedance peaks at the deviation frequencies.

Once the required effective inductance has been determined, the method may now determine whether a second capacitor bank is needed. This occurs in step 505, as the required effective inductance, $L_{Next}$, is compared to the output and connection inductance, $L_{PS}$, of the power source connected to the power distribution system. If the value of $L_{PS}$ is less than or equal to the value of $L_{Next}$, then no additional capacitor banks are necessary (step 506). The power source may be considered to be a capacitor bank having infinite capacitance, and since the inductive reactance from the power source is low enough, the power source may be able to meet the target impedance requirements from the first deviation frequency down to the minimum frequency for which a target impedance must be met.

If the value of $L_{PS}$ is greater than the value of $L_{Next}$, then a second capacitor bank may be needed. Thus, in step 507, the electrical characteristics of the second capacitor bank may be determined. The inductance of the second capacitor bank may be equal to the calculated value of $L_{20}$. Capacitors may be chosen with a resonant frequency that falls within the frequency range for which the second capacitor bank is to provide bypassing. The quantity of capacitors may be set such that the impedance provided by the capacitor bank meets the target impedance requirements for the frequency band to be covered. The capacitors may also be chosen based on their equivalent series inductance, such that the condition $L_{20}=ESL_2/N$ is satisfied, where $ESL_2$ is the equivalent series inductor of a single capacitor of the bank, and N is the quantity of capacitors in the bank.

Figure 4:
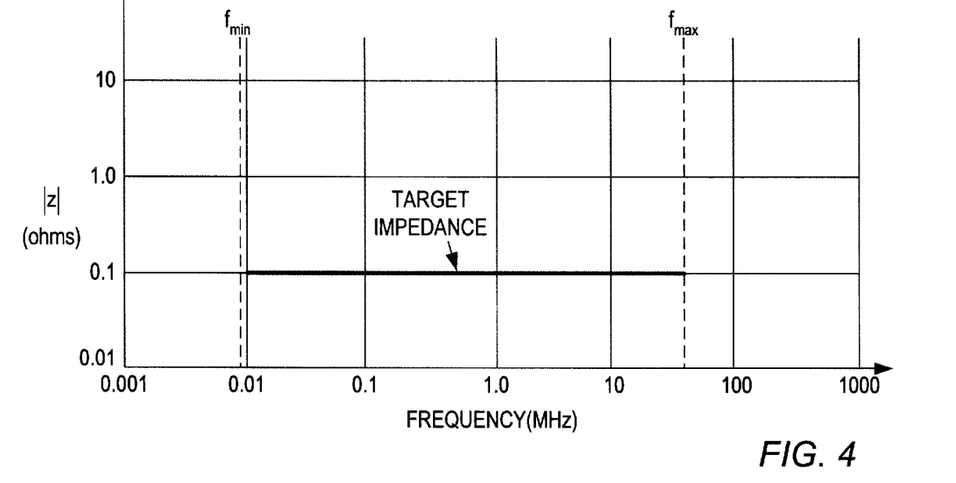
FIG. 4 is a graph illustrating a target impedance profile between a minimum and a maximum frequency for a power distribution system.

Following the determination of the electrical characteristics for a second capacitor bank, a calculation of the required effective inductance for a third capacitor bank may be performed by returning to step 504. The formula used to make the calculation is the same as that for which $L_{20}$ was calculated, with $L_{30}$ substituted for $L_{20}$, and $C_{20}$ and $R_{20}$ substituted for $C_{10}$ and $R_{10}$, respectively. Following this calculation, the output and connection inductance may be compared to the required effective inductance, as in step 505. Again, if the power source output and connection inductance is compared to the required effective inductance of the potential next capacitor bank, as in step 505. The loop between steps 505, 507, and 504 for as many capacitor banks as necessary. Eventually, when the power source output and connection inductance is less than the required effective inductance for a potential next capacitor bank, the method may be completed by moving to step 506. At this point, no further capacitor banks are required. Furthermore, the power source may then act as a final capacitor bank with infinite The next several figures will be used to illustrate the method further through graphs of impedance vs. frequency for a power distribution system with multiple capacitor banks. It should be noted that the electrical characteristic values used herein are exemplary only, and that actual values used in practice may vary widely. Turning now to FIG. 4, a graph illustrating a target impedance profile between a minimum and a maximum frequency for a power distribution system. In the embodiment shown, a target impedance of 0.1 ohms has been chosen for a frequency range extending from approximately 9 kHz ($f_{min}$) up to approximately 50 MHz ($f_{max}$). In other embodiments, the frequency range may be as low as 0 Hz, and has no theoretical upper limit, but may be set in accordance with the electrical requirements of the power distribution system for which the method is to be performed. The frequency range may be selected based on factors such as (but not limited to) clock frequencies, system resonant frequencies, harmonic frequencies, and so on.

Figure 5:
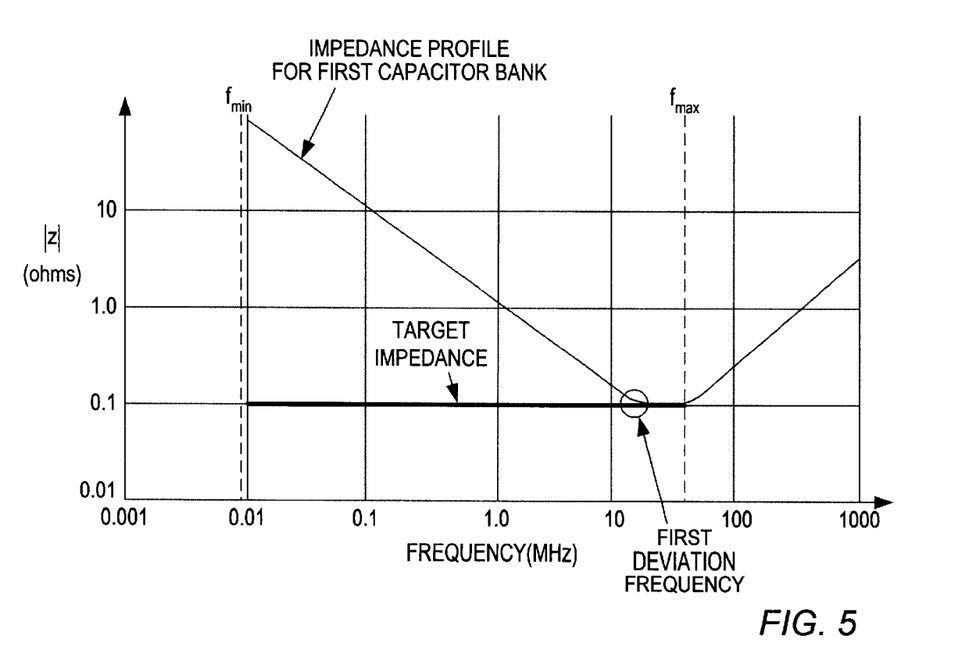
FIG. 5 is a graph illustrating the impedance profile of a pair of planar conductors having a first capacitor bank, wherein the first capacitor bank meets the target impedance requirements of FIG. 4 for a frequency range extending from the maximum frequency down to a first deviation frequency.

Moving now to FIG. 5, a graph illustrating the impedance profile of a pair of planar conductors having a first capacitor bank, wherein the first capacitor bank meets the target impedance requirements of FIG. 4 for a frequency range extending from the maximum frequency down to a first deviation frequency. In the embodiment shown, the impedance provided by the first capacitor bank meets the target impedance requirement near a first deviation frequency of approximately 20 MHz. For frequencies less than the first deviation frequency, the impedance is high at low frequencies, and decreases as frequency increases, as shown by the down slope in the impedance profile. The down slop of the impedance profile represents the capacitive reactance provided by the first capacitor bank. Recall that impedance is inversely proportional to frequency for a given capacitance, or $$Zc = \frac{1}{j\omega C}$$

where Zc is the impedance due to the capacitor, $\omega$ is the angular frequency ($\omega=2\pi f$), and C is the capacitance. Similarly, the up slope of the impedance profile is due to inductive reactance, as $Z_L=j\omega L$, where L is the inductance provided by the capacitor bank. From the first deviation frequency until a frequency above $f_{max}$ the impedance is less than or equal to the target impedance. The capacitors chosen in this example have a quality factor of Q<<1, and thus may be capable of providing an impedance less than or equal to the target impedance over a wide frequency range.

With the electrical characteristics defined for a first capacitor bank, a determination may be made as to whether a second capacitor bank is required. The capacitance provided by the first capacitor bank in this particular example is 0.47 $\mu$F. Since the target impedance is equal for the entire frequency range between $f_{min}$ and $f_{max}$, the constant 'a' is equal to one. For the purposes of this example, assume that the power source output and connection inductance, $L_{PS}$, is 1 $\mu$H. With the capacitance and the target impedance known for the first capacitor bank, the required effective inductance for a second capacitor bank, $L_{20}$, is calculated to be 4.7 nH. Thus, since $L_{PS}$ is greater than $L_{20}$, a second capacitor bank is required.

Figure 6:
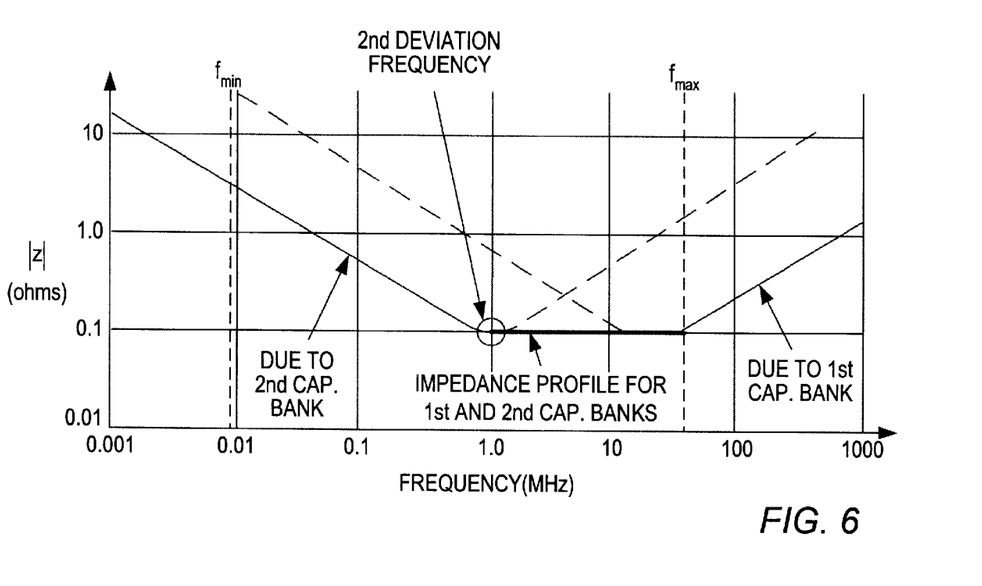
FIG. 6 is a graph illustrating the impedance profile of a pair of planar conductors having first and second capacitor banks, wherein the second capacitor bank meets the target impedance requirements of FIG. 4 for a frequency range extending from the first deviation frequency down to a second deviation frequency.

Moving now to FIG. 6, a graph illustrating the impedance profile of both a first and second capacitor bank is shown. The impedance profile of the second capacitor bank is similar in shape to the impedance profile of the first capacitor bank, and includes a down slope representing capacitive reactance, and an up slope representing inductive reactance. When these two impedance profiles are superimposed upon each other, target impedance requirements may be met for a frequency range extending from approximately a second deviation frequency up to $f_{max}$. This may be true even though neither of the capacitor banks individually meets the target impedance requirements for all frequencies within this range. This is due to the fact that for some frequencies, the inductive reactance of the second capacitor bank is cancelled out by the capacitive reactance of the first capacitor bank. Thus, the impedance profile for the power distribution system with both the first and second capacitor banks remains flat between the second deviation frequency and $f_{max}$. In the example shown, the second deviation frequency is at approximately 1 MHz, and thus, the composite impedance profile meets target impedance requirements for frequencies between 1 MHz and 50 MHz.

Using a capacitance figure of 10 $\mu$F for the capacitance provided by the second capacitor bank, it can now be determined if a third capacitor bank is required. Using the capacitance figure of 10 $\mu$F and an impedance figure of 0.1 ohms, the required effective inductance for a third capacitor bank, $L_{30}$, is found to be 0.1 $\mu$H. Thus, $L_{PS}$ is greater than $L_{30}$, and therefore a third capacitor bank is required.

Figure 7:
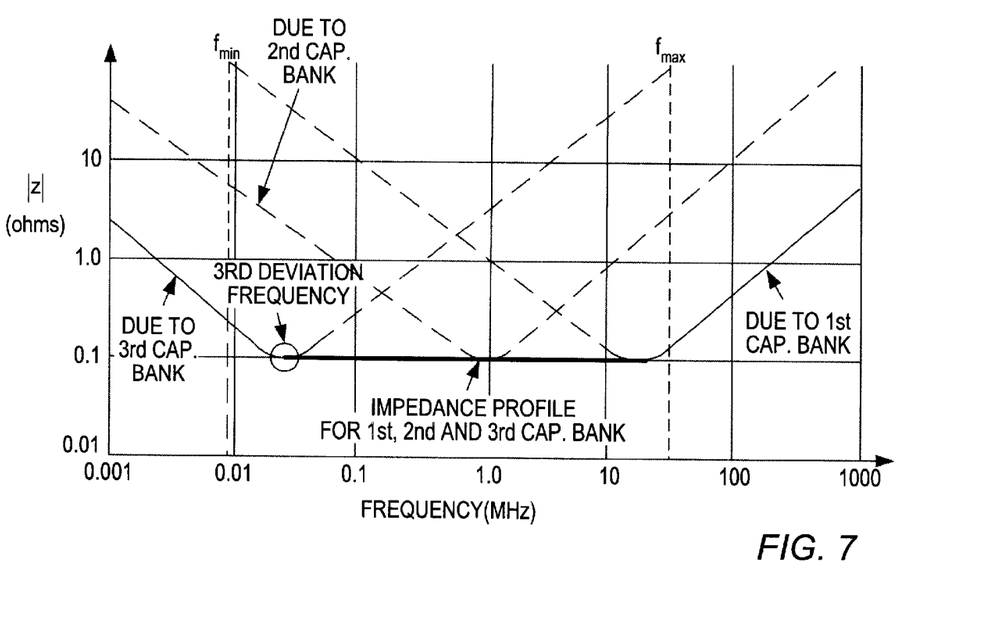
FIG. 7 is a graph illustrating the impedance profile of a pair of planar conductors having first, second an third capacitor banks, wherein the third capacitor bank meets the target impedance requirements of FIG. 4 for a frequency range extending from the second deviation frequency down to the third deviation frequency of the target impedance profile.

The composite impedance profile of the three capacitor banks is illustrated in FIG. 7. With the addition of the third capacitor bank, with a capacitance of 470 $\mu$F, the target impedance requirement may be met from the second deviation frequency down to the third deviation frequency. The third deviation frequency, for this example, occurs at approximately 30 kHz. Thus, the combined effects of the first, second, and third capacitor banks may result in the meeting of the target impedance requirements from 30 kHz up to 50 MHz. At points between the second and third deviation frequencies, the capacitive reactance of the second bank may be cancelled out by the inductive reactance of the third capacitor bank, resulting in a flat impedance profile between these frequencies.

With a third capacitor bank in place, a determination can now be made as to the need for a fourth capacitor bank. Using a figure of 470 $\mu$F for $C_{30}$ and 0.1 ohms for $R_{30}$, the required effective inductance for a fourth capacitor bank, $L_{40}$, is found to be 4.7 $\mu$H. Since the power source output and connection inductance, $L_{PS}$, is only 1 $\mu$H, the power source meets the inductance requirements in this case, and thus, no further capacitor banks are required beyond the first three. The power source may serve as a fourth capacitor bank having infinite capacitance. For this particular example, the power source may provide a sufficiently low impedance to meet target impedance requirements between the third deviation frequency and $f_{min}$.

Figure 8:
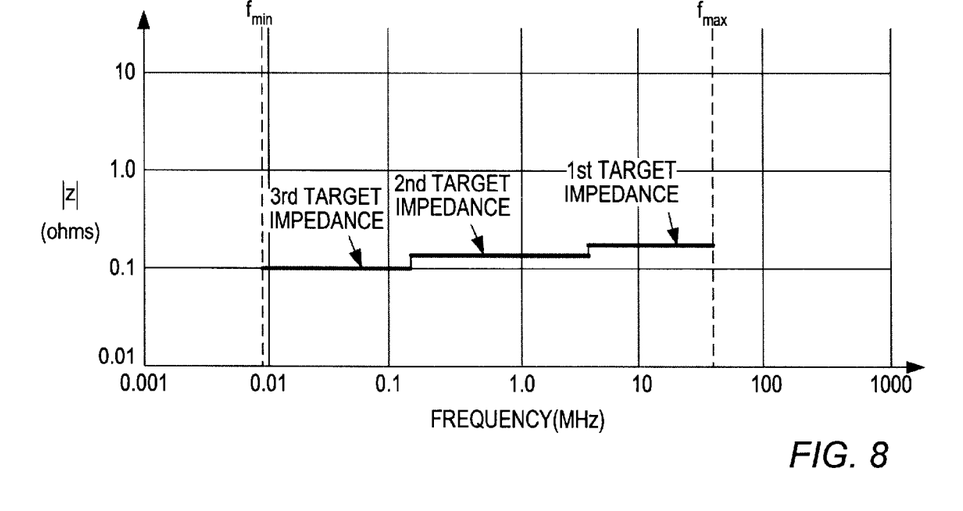
FIG. 8 is a graph illustrating a target impedance profile between a minimum and a maximum frequency for a power distribution system, wherein multiple frequency ranges are present between the minimum and maximum frequencies, with each frequency range having a unique target impedance with respect to the other frequency ranges.

Moving now to FIG. 8, a graph illustrating a target impedance profile between a minimum and a maximum frequency for a power distribution system, wherein multiple frequency ranges are present between the minimum and maximum frequencies, with each frequency range having a unique target impedance with respect to the other frequency ranges is shown. The deviation frequencies used in this example are the same as those used in the previous example of FIGS. 5, 6, and 7. For the frequency band extending from $f_{max}$ down to the first deviation frequency of 20 MHz, the target impedance $R_{10}$ is 0.12 ohms. From the first deviation frequency down to the second deviation frequency of 1 MHz, the target impedance R20 is 0.11 ohms. The target impedance, $R_{30}$, for the second deviation frequency down to $f_{min}$, 9 kHz, (which includes the third deviation frequency of 30 kHz) is 0.1 ohms. It should be noted that these resistance values are exemplary only, and that the actual values in practice may vary widely. Differences of a factor of two or more may be common in some instances, and may even vary by an order of magnitude. Since the target impedances within the three frequency bands are different with respect to each other, the calculation of the required effective inductance may require the use of the weighing factor 'a' in order to ensure there is a smooth impedance transition between the capacitor banks. This weighing factor will be further explained in reference to FIG. 10.

Figure 9:
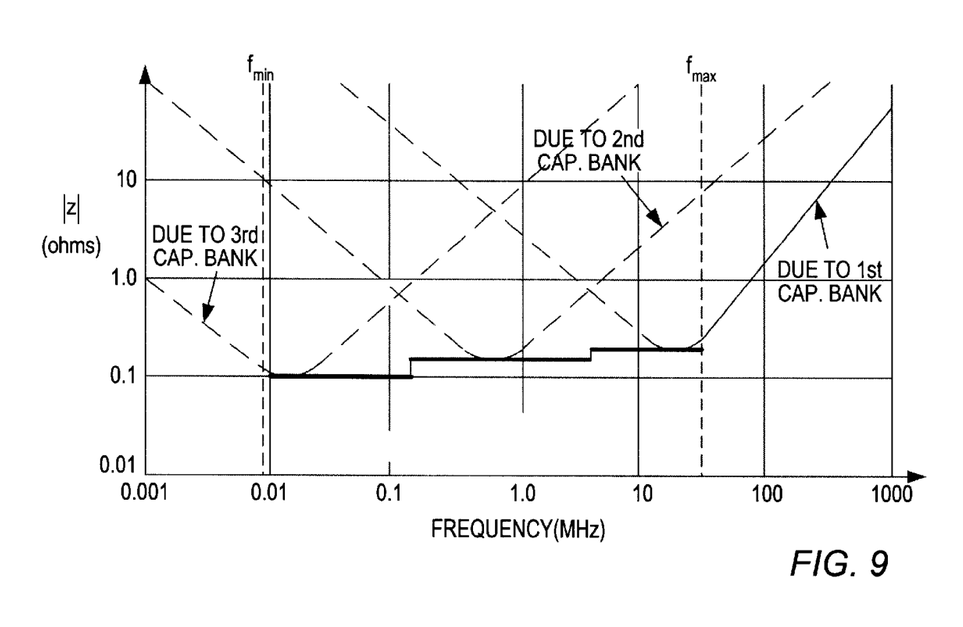
FIG. 9 is a graph illustrating the impedance profile of a pair of planar conductors having multiple capacitor banks, wherein each of the capacitor banks meets the target impedance requirements for one of the frequency ranges shown in the target impedance profile of FIG. 8.

FIG. 9 is a graph illustrating the impedance profile of a pair of planar conductors having multiple capacitor banks, wherein each of the capacitor banks meets the target impedance requirements for one of the frequency ranges shown in the target impedance profile of FIG. 8. The target impedance for the frequency range extending from $f_{max}$ down to the first deviation frequency of 20 MHz may be met by the first capacitor bank, which has a capacitance of 0.47 μF for this example. For the purposes of this example, it is assumed the power supply output and connection inductance, $L_{PS}$, is 1 μH. As previously stated, the required effective inductance for the second capacitor bank may be found by the formula $L_{20}=a*(C_{10})*(R_{10})^2$. In this example, using a value of a=1.082, $C_{10}$=4.7 μF, and $R_{10}$=0.12 ohms, the value of $L_{20}$ is found to be 5.085 nH. Since the value of $L_{PS}$ is 1 μH, the power supply output and connection inductance cannot meet the effective inductance requirement in this situation, and thus a second capacitor bank is required.

In this example, a capacitor bank having a capacitance of 10 μH may meet the target impedance requirements for the frequency range from the first deviation frequency of 20 MHz down to the second deviation frequency of 1 MHz. The required effective inductance, $L_{30}$, for a third capacitor bank may be calculated using a value of a=1.076, $C_{20}$=10 μF, and $R_{20}$=0.11 ohms, and results in a value of $L_{30}$=0.1076 μH. Since the value of $L_{PS}$ is greater than the value of $L_{30}$, a third capacitor bank is required in this example.

The third capacitor bank in this example may meet target the target impedance requirements for the second deviation frequency of 1 MHz down to the third deviation frequency of 30 kHz. For this frequency range, as well as the frequency range from the third deviation frequency down to $f_{min}$, 9 kHz, the target impedance is 0.1 ohms. Since the target impedance is equal for values both above and below the third deviation frequency, a value of a=1 may be used in determining whether or not a fourth capacitor bank is required. The capacitance provided by the third capacitor bank, $C_{30}$, is 470 μF. The calculation of the required effective inductance for a fourth is calculated to be 4.7 μH. This value is greater than the value of $L_{PS}$, which is 1 μH. Thus, no fourth capacitor bank is required for this example, since the power supply output and connection inductance can meet the required effective inductance for a fourth capacitor bank.

Turning now to FIG. 10, is a graph illustrating the constant 'a' that may be required for calculations necessary to determine the need for additional capacitor banks is shown. The value of 'a' as shown here may be a function of the ratio 'r' of the impedance provided by a second capacitor bank to a first capacitor bank (or third to second, etc.). This ratio can be expressed generally as $r=(R_i+1)/R_i$, wherein ($R_i$+1) is the impedance of a next (e.g. $2^{nd}$) capacitor bank and $R_i$ is the impedance of a previous (e.g. $1^{st}$) capacitor bank. The data in the graph was obtained by simulating operation of a power distribution system having two capacitor banks, and varying the ratio of impedances between them. After plotting points from data obtained and performing a curve-fitting algorithm, a second-degree polynomial function, $a=-0.0758r^2+0.6232r+0.4469$, was obtained for this embodiment. The value of 'a' obtained from calculating the value of the function for a particular value of 'r' may be used to calculate the required effective inductance for a next capacitor bank. In cases where ($R_i$+1)=$R_i$, and therefore r=1, the value of a=1 for this embodiment.

It should be noted that data upon which the polynomial function of 'a' is based may only apply to the particular embodiment of the power distribution system for which simulation was performed. Other embodiments of power distribution systems for which the method described herein is applied may require their own simulation. The data obtained from such a simulation, and the resulting polynomial function, may be different than the one in the example of FIG. 10.

Figure 11:
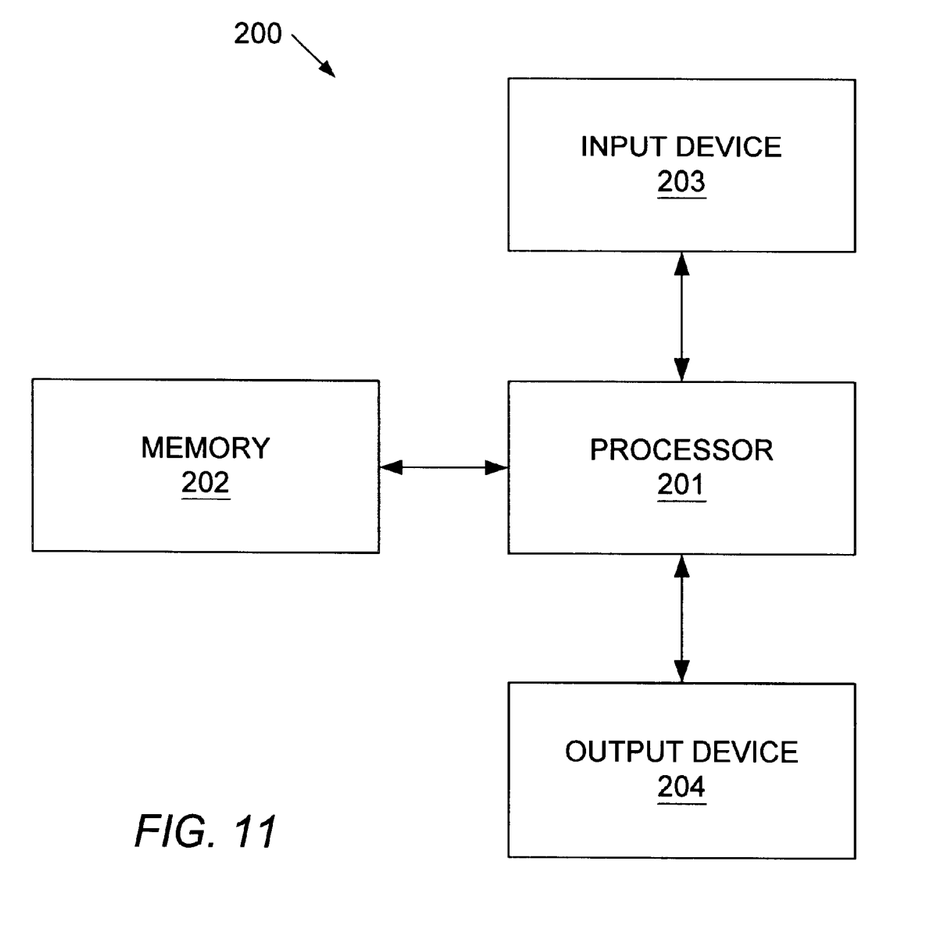
FIG. 11 is a block diagram illustrating one embodiment of a computer system for performing the various embodiments of the method described herein.

Moving now to FIG. 11, a block diagram illustrating one embodiment of a computer system that implements the method described above in conjunction with FIGS. 3 through 9 is shown. Computer system 200 includes a processor 201 coupled to an input device 203, an output device 204, and a carrier medium 202. In one embodiment, carrier medium may be a type of memory.

Various additional embodiments may further include receiving, sending, or storing instructions and/or data executable to implement the method as described above in reference to FIGS. 3 through 9. Generally speaking, a carrier medium may include storage media (e.g. hard disk storage or floppy disk storage) or memory media such as magnetic or optical media, e.g., disk or CD-ROM (compact disk read only memory), volatile or non-volatile media such as various types of random access memory (RAM) including DRAM, SRAM, SDRAM, RDRAM, read-only memory (ROM), and flash memory. Media may also include flash memory and DVD-ROM (digital versatile disk ROM). Carrier media may also include transmission media or signals such as electrical, electromagnetic, or digital signals, conveyed via a communication medium such as a network and/or wireless link.

Input device 203 may be one or more of several different input devices, such as a keyboard, a mouse, a touch-screen monitor, a floppy disk device, and any of the devices listed as carriers above. Results obtained by performing the method using computer system 200 may be forwarded to an output device 204. Output device 204 may be one or more of several different output devices, such as a monitor, a printer, and any of the devices listed above a carriers. It should also be noted that a network interface card may be used in this embodiment as an input device, and output device, or a carrier, and further, that computer system 200 may perform the method in conjunction with other computer systems to which it is connected to via a computer network.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method for achieving a target impedance in an electrical power distribution structure, the method comprising:

defining a first capacitor bank, said first capacitor bank having a plurality of capacitors, such that an impedance provided by said first capacitor bank is less than or equal to a target impedance for a first frequency range extending from a maximum frequency down to a first frequency;

determining a required effective inductance for a second capacitor bank, said second capacitor bank having a plurality of capacitors;

determining a need for a second capacitor bank, wherein said second capacitor bank is required if said required effective inductance is less than an inductance from a power source connected to said electrical power distribution structure; and determining the electrical characteristics for said second capacitor bank if said second capacitor bank is required.

2. The method as required in claim 1 further comprising determining a need for a third capacitor bank, said third capacitor bank having a plurality of capacitors, wherein said third capacitor bank is required if a second required effective inductance is less than said inductance from said power source, and wherein an impedance provided by said third capacitor bank is less than or equal to a target impedance for a third frequency range extending from said second frequency down to a third frequency.

3. The method as recited in claim 2, wherein said power source comprises a final capacitor bank.

4. The method as recited in claim 1, wherein electrical characteristics of said first capacitor bank include a first capacitance ($C_{10}$), a first resistance ($R_{10}$), and a first inductance ($L_{10}$).

5. The method as recited in claim 4, wherein said required effective inductance is determined by the formula $L_{20}=a*(C_{10})*(R_{10})^2$, wherein $L_{20}$ is the required effective inductance, a is a mathematical constant, $C_{10}$ is the first capacitance, and $R_{10}$ is the first resistance.

6. The method as recited in claim 5, wherein said first capacitance is the total capacitance provided by said first capacitor bank.

7. The method as recited in claim 6, wherein said first capacitance is determined by the formula $C_{10}=N*C_1$, wherein N is the quantity of capacitors in the first capacitor bank and $C_1$ is the capacitance of a single capacitor in the first capacitor bank.

8. The method as recited in claim 4, wherein said first resistance is the impedance provided by said first capacitor bank.

9. The method as recited in claim 8, wherein said first resistance is determined by the formula $R_{10}=ESR_1/N$, wherein $ESR_1$ is the equivalent series resistance of a single capacitor in the first capacitor bank and N is the quantity of capacitors in the first capacitor bank.

10. The method as recited in claim 9, wherein said single capacitor has a quality factor (Q) less than 1.

11. The method as recited in claim 10, wherein said first inductance is determined by the formula $L_{10}=ESL_1/N$, wherein $ESL_1$ is the equivalent series inductance of a single capacitor in the capacitor bank, and N is the quantity of capacitors in the first capacitor bank.

12. The method as recited in claim 4, wherein said first inductance is the inductance provided by said first capacitor bank.

13. The method as recited in claim 1, wherein said second capacitor bank is implemented to provide an impedance less than or equal to a target impedance for a second frequency range extending from said first frequency down to a second frequency.

14. The method as recited in claim 13, wherein said target impedance for said first frequency range is equal to said target impedance for said second frequency range.

15. The method as recited in claim 13, wherein said target impedance for said second frequency range is not equal to said target impedance for said first frequency range.

16. A system for determining the capacitors required for achieving a target impedance in an electrical power distribution structure, the system comprising:
 a processor;
 a memory coupled to said processor, wherein said memory stores instructions executable by the processor to implement the method of:
  defining a first capacitor bank, said first capacitor bank having a plurality of capacitors, such that an impedance provided by said first capacitor bank is less than or equal to a target impedance for a first frequency range extending from a maximum frequency down to a first frequency;
  determining a required effective inductance for a second capacitor bank, said second capacitor bank having a plurality of capacitors;
  determining a need for a second capacitor bank, wherein said second capacitor bank is required if said required effective inductance is less than an inductance from a power source connected to said electrical power distribution structure; and
  determining the electrical characteristics for said second capacitor bank if said second capacitor bank is required.

17. The system as recited in claim 16, wherein said instructions are further executable to determine a need for a third capacitor bank, said third capacitor bank having a plurality of capacitors, wherein said third capacitor bank is required if a second required effective inductance is less than said inductance from said power source, and wherein an impedance provided by said third capacitor bank is less than or equal to a target impedance for a third frequency range extending from said second frequency down to a third frequency.

18. The system as recited in claim 17, wherein said power source comprises a final capacitor bank.

19. The system as recited in claim 16, wherein electrical characteristics of said first capacitor bank include a first capacitance ($C_{10}$), a first resistance ($R_{10}$), and a first inductance ($L_{10}$).

20. The system as recited in claim 19, wherein said required effective inductance is determined by the formula $L_{20}=a*(C_{10})*(R_{10})^2$, wherein $L_{20}$ is the required effective inductance, a is a mathematical constant, $C_{10}$ is the first capacitance, and $R_{10}$ is the first resistance.

21. The system as recited in claim 20, wherein said first capacitance is determined by the formula $C_{10}=N*C_1$, wherein N is the quantity of capacitors in the first capacitor bank and $C_1$ is the capacitance of a single capacitor in the first capacitor bank.

22. The system as recited in claim 19, wherein said first capacitance is the total capacitance provided by said first capacitor bank.

23. The system as recited in claim 19, wherein said first resistance is the impedance provided by said first capacitor bank.

24. The system as recited in claim 23, wherein said first resistance is determined by the formula $R_{10}=ESR_1/N$, wherein $ESR_1$ is the equivalent series resistance of a single capacitor in the first capacitor bank and N is the quantity of capacitors in the first capacitor bank.

25. The system as recited in claim 24, wherein said single capacitor has a quality factor (Q) less than 1.

26. The system as recited in claim 19, wherein said first inductance is the inductance provided by said first capacitor bank.

27. The system as recited in claim 26, wherein said first inductance is determined by the formula $L_{10}=ESL_1/N$, wherein $ESL_1$ is the equivalent series inductance of a single capacitor in the capacitor bank, and N is the quantity of capacitors in the first capacitor bank.

28. The system as recited in claim 16, wherein said second capacitor bank is implemented to provide an impedance less than or equal to a target impedance for a second frequency range extending from said first frequency down to a second frequency.

29. The system as recited in claim 28, wherein said target impedance for said first frequency range is equal to said target impedance for said second frequency range.

30. The system as recited in claim 28, wherein said target impedance for said first frequency range is not equal to said target impedance for said second frequency range.

31. The system as recited in claim 16, wherein said memory is a DRAM.

32. The system as recited in claim 16, wherein said memory is an SRAM.

33. The system as recited in claim 16, wherein said memory is hard disk storage.

34. The system as recited in claim 16, wherein said memory is a flash memory.

35. The system as recited in claim 16, wherein said memory is a CD-ROM.

36. The system as recited in claim 16, wherein said memory is a DVD-ROM.

37. A carrier medium configured for storing instructions that, when executed by a processor coupled to said carrier medium, determine the capacitors for achieving a target impedance in an electrical power distribution structure, the method comprising:

defining a first capacitor bank, said first capacitor bank having a plurality of capacitors, such that an impedance provided by said first capacitor bank is less than or equal to a target impedance for a first frequency range extending from an maximum frequency down to a first frequency;

determining a required effective inductance for a second capacitor bank, said second capacitor bank having a plurality of capacitors;

determining a need for a second capacitor bank, wherein said second capacitor bank is required if said required effective inductance is less than an inductance from a power source connected to said electrical power distribution structure; and determining the electrical characteristics for said second capacitor bank if said second capacitor bank is required.

38. The carrier medium as recited in claim 37, wherein said instructions when executed by said processor determine a need for a third capacitor bank, said third capacitor bank having a plurality of capacitors, wherein said third capacitor bank is required if a second required effective inductance is less than said inductance from said power source, and wherein an impedance provided by said third capacitor bank is less than or equal to a target impedance for a third frequency range extending from said second frequency down to a third frequency.

39. The carrier medium as recited in claim 38, wherein said power source comprises a final capacitor bank.

40. The carrier medium as recited in claim 38, wherein electrical characteristics of said first capacitor bank include a first capacitance ($C_{10}$), a first resistance ($R_{10}$), and a first inductance ($L_{10}$).

41. The carrier medium as recited in claim 40, wherein said required effective inductance is determined by the formula $L_{20}=a*(C_{10})*(R_{10})^2$, wherein $L_{20}$ is the required effective inductance, a is a mathematical constant, $C_{10}$ is the first capacitance, and $R_{10}$ is the first resistance.

42. The carrier medium as recited in claim 41, wherein said first resistance is determined by the formula $R_{10}=ESR_1/N$, wherein $ESR_1$ is the equivalent series resistance of a single capacitor in the first capacitor bank and N is the quantity of capacitors in the first capacitor bank.

43. The carrier medium as recited in claim 42, wherein said single capacitor has a quality factor (Q) less than 1.

44. The carrier medium as recited in claim 40, wherein said first resistance is the impedance provided by said first capacitor bank.

45. The carrier medium as recited in claim 40, wherein said first capacitance is the total capacitance provided by said first capacitor bank.

46. The carrier medium as recited in claim 42, wherein said first capacitance is determined by the formula $C_{10}=N*C_1$, wherein N is the quantity of capacitors in the first capacitor bank and $C_1$ is the capacitance of a single capacitor in the first capacitor bank.

47. The carrier medium as recited in claim 40, wherein said first inductance is the inductance provided by said first capacitor bank.

48. The carrier medium as recited in claim 47, wherein said first inductance is determined by the formula $L_{10}=ESL_1/N$, wherein $ESL_1$ is the equivalent series inductance of a single capacitor in the capacitor bank, and N is the quantity of capacitors in the first capacitor bank.

49. The carrier medium as recited in claim 37, wherein said second capacitor bank is implemented to provide an impedance less than or equal to a target impedance for a second frequency range extending from said first frequency down to a second frequency.

50. The carrier medium as recited in claim 49, wherein said target impedance for said second frequency range is equal to said target impedance of said first frequency range.

51. The carrier medium as recited in claim 49, wherein said target impedance for said second frequency range is not equal to said target impedance of said first frequency range.

52. The carrier medium as recited in claim 37, wherein said carrier medium is a DRAM.

53. The carrier medium as recited in claim 37, wherein said carrier medium is an SRAM.

54. The carrier medium as recited in claim 37, wherein said carrier medium is hard-disk storage.

55. The carrier medium as recited in claim 37, wherein said carrier medium is a flash memory.

56. The carrier medium as recited in claim 37, wherein said carrier medium is a CD-ROM.

57. The carrier medium as recited in claim 37, wherein said carrier medium is a DVD-ROM.

* * * * *